United States Patent
Schaffer et al.

(10) Patent No.: US 7,116,955 B2
(45) Date of Patent: Oct. 3, 2006

(54) DUAL LOOP AUTOMATIC GAIN CONTROL

(75) Inventors: Troy A. Schaffer, Newtown, PA (US); Samir N. Hulyalkar, Newtown, PA (US); Anand M. Shah, San Francisco, CA (US)

(73) Assignee: ATI Technologies, Inc., Ontario (CA)

( * ) Notice: Subject to any disclaimer, the term of this patent is extended or adjusted under 35 U.S.C. 154(b) by 335 days.

(21) Appl. No.: 10/253,245

(22) Filed: Sep. 24, 2002

(65) Prior Publication Data
US 2004/0063413 A1    Apr. 1, 2004

(51) Int. Cl.
*H04B 1/06*    (2006.01)
(52) U.S. Cl. ................. 455/234.1; 455/239.1; 455/250.1; 455/253.1; 455/253.2; 375/345; 375/346
(58) Field of Classification Search ............. 455/234.1, 455/239.1–250.1, 253.1, 253.2, 311, 341, 455/344, 232.1, 236.1, 136, 138, 425, 426, 455/424, 456.5, 456.6, 550.1, 575.1, 561, 455/127.2, 135; 330/133, 75, 103, 254, 278, 330/289, 134, 132; 375/345, 297, 141, 146, 375/346, 240.07, 233, 136, 147; 370/463, 370/501, 320, 342; 348/729, 707; 324/76, 324/35
See application file for complete search history.

(56) References Cited
U.S. PATENT DOCUMENTS

| | | | |
|---|---|---|---|
| 4,614,935 A | 9/1986 | Fling | |
| 5,629,884 A * | 5/1997 | Pan et al. | 708/517 |
| 6,107,878 A | 8/2000 | Black | |
| 6,177,839 B1 | 1/2001 | Ishihara | |
| 6,333,675 B1 * | 12/2001 | Saito | 330/133 |
| 6,654,594 B1 * | 11/2003 | Hughes et al. | 455/245.1 |
| 6,707,865 B1 * | 3/2004 | Challa | 375/345 |
| 2001/0022821 A1 * | 9/2001 | Ichihara | 375/317 |
| 2002/0168037 A1 * | 11/2002 | Chen | 375/344 |
| 2003/0139160 A1 * | 7/2003 | Yang | 455/226.1 |
| 2003/0162518 A1 * | 8/2003 | Baldwin et al. | 455/253.2 |
| 2003/0218501 A1 * | 11/2003 | Oshima et al. | 330/133 |

OTHER PUBLICATIONS

J. N. Mitchell, Jr.; "Computer Multiplication and Division Using Binary Logarithms"; IRE Transactions on Electronic Computers; vol. 11, Aug. 1962; pp. 512-517.
Isaac Martinez G.; "Automatic Gain Control (AGC) Circuits, Theory and Design"; University of Toronto; Fall 2001; http://www.eecg.toronto.edu/~kphang/ece1352f/papers/martin AGC.pdf.

* cited by examiner

*Primary Examiner*—Nguyen T. Vo
*Assistant Examiner*—Charles Chow
(74) *Attorney, Agent, or Firm*—RatnerPrestia

(57) ABSTRACT

An AGC circuit includes both wide-band and narrow-band VGAs. Two power monitors monitor the power level of the two VGAs. Based upon the signals provided by the power monitors, the AGC circuit derives two error terms. The AGC circuit filters and combines the error terms to determine a desired adjustment to the total gain and a desired adjustment to the distribution of the gain between the wide-band VGA and the narrow-band VGA. The AGC circuit also minimizes the noise figure of the narrow-band VGA subject to linearity constraints.

16 Claims, 11 Drawing Sheets

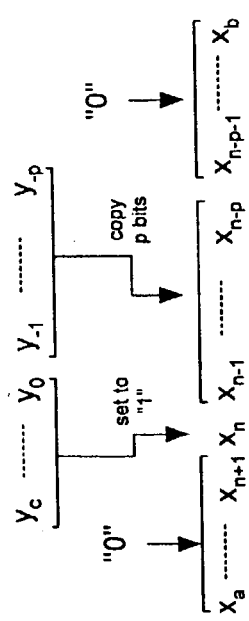
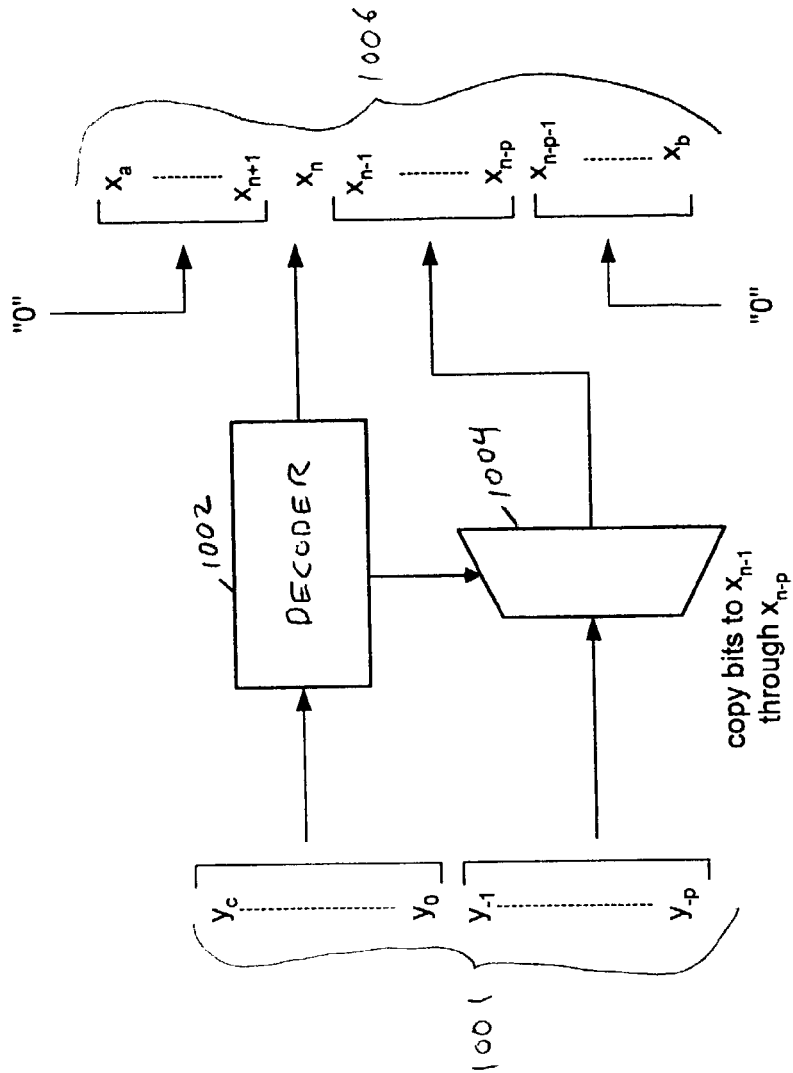
Figure 10A
Figure 10B

DUAL LOOP AUTOMATIC GAIN CONTROL

FIELD OF INVENTION

This invention relates to automatic gain control (AGC) circuits and in particular to a multi-loop AGC circuit that divides gain among multiple stages to achieve maximum signal to noise ratio while maintaining distortion below an acceptable limit.

BACKGROUND

A typical terrestrial signal receiver includes a wide-band radio frequency (RF) stage in which broadcast signals are amplified. These signals are then converted to an intermediate frequency (IF) by a mixer, filtered and further amplified by an IF amplifier stage to provide a narrow-band signal to a demodulator.

Terrestrial receivers typically include one or more variable gain amplifier (VGA) stages to accommodate the wide range of received signal power that may be encountered in practice. The gains of these amplifiers are adjusted to achieve a desired signal level at the demodulator. For example, one VGA circuit may amplify the broadcast signals at the RF stage and another may amplify the signals at the IF stage. It is the function of the automatic gain control (AGC) algorithm to set the gain of each VGA such that the power of the desired signal presented to demodulator is maintained at approximately the prescribed level. Furthermore, because amplifiers can introduce spurious electrical signals (i.e. "noise") into the signal and because non-linearities in amplifiers and mixers can distort the amplified signal, practical aspects of AGC circuits including device "noise figure" and "linearity" are desirably considered when adjusting the gain of each VGA.

SUMMARY OF INVENTION

The present invention is embodied in a novel AGC method and its corresponding circuit which addresses the practical considerations without sacrificing performance related to the fundamental objective of maintaining the desired power level at the demodulator.

The exemplary AGC circuit includes first and second VGAs in an AGC loop. The AGC circuit includes control circuitry that determines a desired adjustment to the total gain of the AGC circuit and a desired adjustment to the distribution of the gain between the two VGAs.

According to another aspect of the subject invention the noise figure of the second VGA is minimized subject to linearity constraints.

BRIEF DESCRIPTION OF THE DRAWINGS

FIGS. 9 and 10B are block diagram of first and second exemplary circuitry suitable for use as the exponential conversion circuitry shown in FIG. 2.

FIG. 10A is a bit transformation chart which is useful for describing the second exemplary exponential circuitry shown in FIG. 10B.

DETAILED DESCRIPTION

The present invention concerns digital communications receivers that receive a signal through a channel having an attenuation that varies over a large range, is unknown, and often changes dynamically. Specifically, the present invention relates to a method of adjusting the amplification applied to the received signal in response to a desired signal level, other involved signals, and with respect to practical hardware performance constraints. The present invention also concerns the efficient implementation of required operations underlying the AGC algorithm.

It is desirable for the AGC circuitry to have the characteristics of a linear system so that its operation can be understood and analyzed using the large developed body of linear systems theory. In a particular algorithm, logarithms and exponential functions may be implemented digitally. The present invention employs efficient conversion algorithms suitable for implementation within an integrated circuit or microprocessor program.

Figure 1:
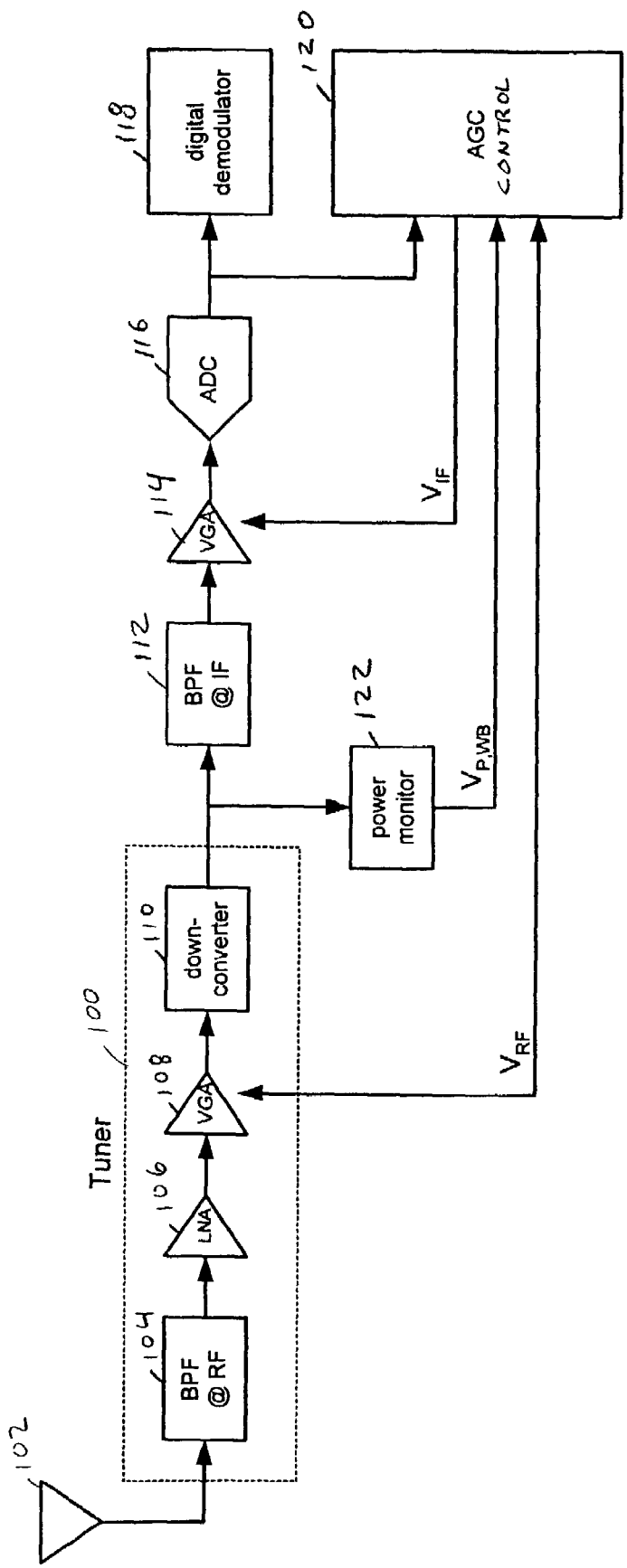
FIG. 1 is a block diagram of an AGC system according to the present invention.

A terrestrial receiver in accordance with the subject invention is shown in FIG. 1. The antenna 102 receives many signals across a wide frequency band. The tuner 100 includes a band-pass filter 104 that selects a wide-band portion of this spectrum containing the desired signal. A wide-band low-noise amplifier 106 amplifies the selected portion of the spectrum according to a fixed amplification factor and provides the amplified signal to a VGA 108 that further amplifies it according to a first variable amplification factor. An exemplary model for the VGAs used in the present invention is described below with reference to FIG. 3.

While the exemplary embodiment of the invention is described in terms of a terrestrial receiver, it is contemplated that it is generally applicable to radio-frequency (RF) receivers and may be used in other types of receivers, such as a satellite receiver or a cable television receiver.

The amplified wide-band signal provided by the VGA 108 is applied to a down-converter 110 that translates the it to an intermediate frequency (IF). The down-converter 110, may include, for example, a local oscillator (not shown) and a mixer (not shown) which heterodynes the wide-band signal provided by the VGA 108 with the signal provided by the local oscillator to produce a wide-band signal that is shifted to a lower frequency band. The lower frequency band includes the intermediate frequency.

At the output terminal of the tuner, the bandwidth of the signal is typically much wider than the bandwidth of the desired signal. Thus, a BPF 112 at the intermediate frequency is applied to provide a narrow-band signal in which all frequencies are suppressed except a narrow band including the desired signal. A second VGA 114 amplifies the narrow-band signal according to a second variable amplification factor and applies the amplified narrow-band signal to an analog-to-digital converter (ADC) 116 which digitizes the signals for processing by a digital demodulator 118. The first VGA 108 and the second VGA 114 are both part of the gain control loop. The second VGA 114 controllably amplifies signals that have already been amplified by the first VGA 108.

For the receiver to function well, signal levels are desirably adjusted at strategic points in the circuit. The wide-band VGA 108 is used to adjust the input signal level to the down-converter 110. At this point in the system, the wide-band signal includes the desired signal and one or more undesired signals that fall within the bandwidth of the wide-band BPF 104. If level of the signal applied to the down-converter 110 is too low, the noise figure of the receiver will be poor. If the signal level to the down-converter 110 is too high, the down-converter may introduce distortion, again resulting in poor system performance. In addition, the noise factors of each of the VGAs increase as their respective gains are decreased. To optimize performance, the wide-band VGA 108 is desirably adjusted to the maximum gain setting that results in acceptable signal distortion at the digital demodulator 118.

Figure 2:
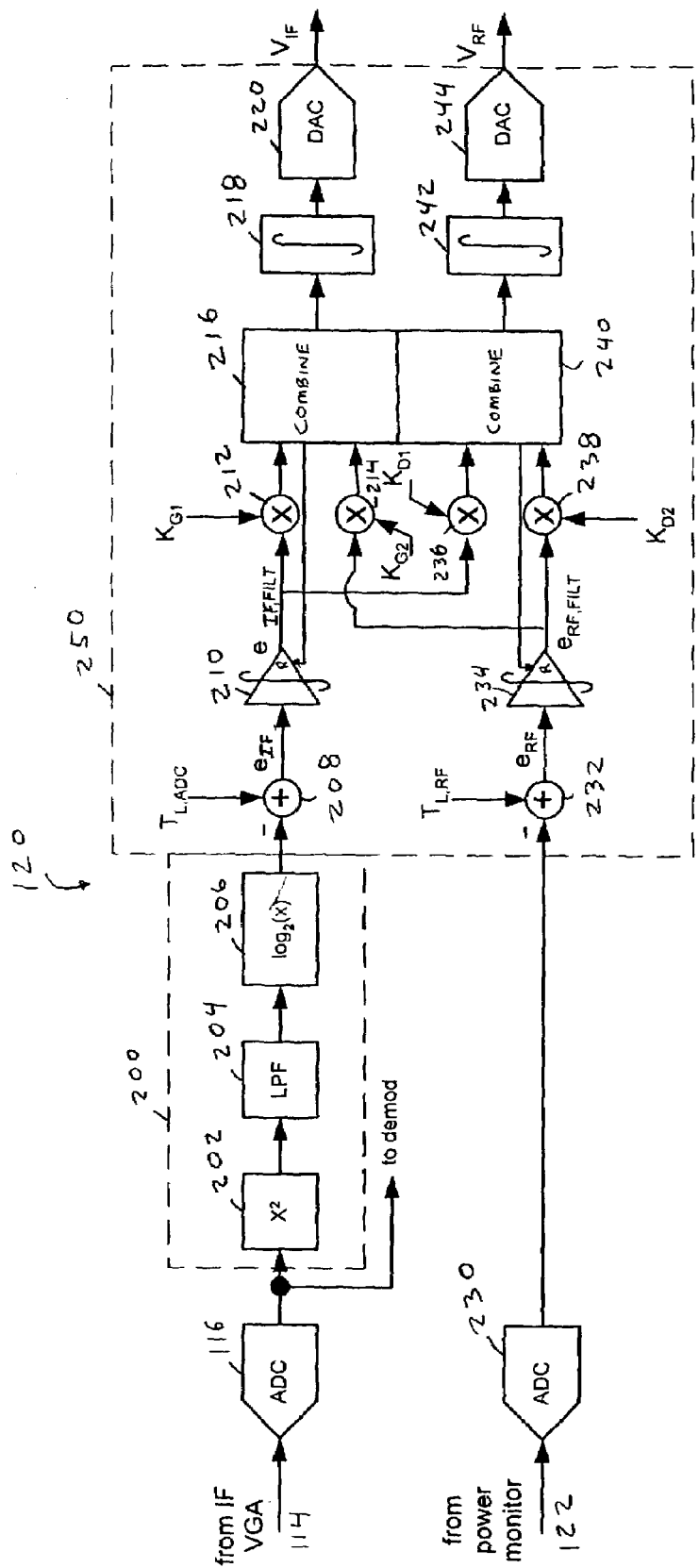
FIG. 2 is a block diagram of an AGC control circuit suitable for use with the AGC system shown in FIG. 1.

The combined gains of the VGAs 108 and 114 are adjusted so that the power level presented to the ADC 116 is substantially at a prescribed level ($T_{L,ADC}$, shown in FIG. 2). In the exemplary embodiment of the invention, the first priority is to provide a signal having the desired power level to the ADC 116. A second priority is to maximize the part of that gain that is provided by the wide-band VGA 108 subject to the noise figure and linearity constraints, described above.

The exemplary narrow-band VGA 114 adjusts the level of the narrow-band signal at the input port of the ADC 116. This signal level depends upon the gain signals applied to both of the VGAs 108 and 114. Because of the filtering by the narrow-band BPF 112, the signal applied to the VGA 114 primarily consists of the desired signal. If the level of the signal applied to the ADC 116 is too low, the digitized signal provided by the ADC 116 may include excessive quantization noise which degrades the signal-to-noise ratio (SNR) of the desired signal. If the level of this signal is too high, the output signal of the ADC 116 is subject to clipping distortion when the excursions of the input signal exceed the input window of the ADC and the corresponding digital values are held at the maximum value that can be provided by the ADC.

The receiver shown in FIG. 1 includes AGC control circuitry 120 and power monitoring circuitry 122 which adjust the respective gains of the VGAs 108 and 114 according to a predetermined algorithm. In the exemplary embodiment of the invention, the power monitoring circuitry 122 is an analog logarithmic power monitor. The power monitor 122 is coupled to the output port of the tuner 110 and provides a measure of the power level of the wide-band signal to the AGC control circuitry 120. The control circuitry 120 also receives the narrow-band signal as the output signal of the ADC 116. It calculates a power level of the narrow-band signal and, using the calculated power level and the measured power level of the wide-band signal, calculates control voltages, $V_{RF}$ and $V_{IF}$ for the wide-band VGA 108 and narrow-band VGA 114, respectively.

Circuitry suitable for use as the AGC control circuitry 120 is shown in FIG. 2. This circuitry implements the power control algorithm employed by the receiver shown in FIG. 1. This circuit includes two parts, a power monitor circuit 200 and a gain control circuit 250.

In the power monitor circuit 200, the digitized signal from the ADC 116 is processed by a squaring circuit 202 to calculate values corresponding to the instantaneous power of each digitized sample. A low-pass filter (LPF) 204 processes the squared samples to produce a signal indicating a running average of the signal power level. Next, a $\log_2(x)$ circuit 206 converts the linear power estimate to a logarithmic one. Circuitry suitable for use as the $\log_2(x)$ circuit is described below with reference to FIGS. 6, 7A and 7B. While the exemplary circuitry 200 employs a squaring circuit 202 to obtain an instantaneous power measurement, it is contemplated that other circuitry, for example, an absolute value circuit (not shown) may be used in place of the squaring circuit. Furthermore, it is contemplated that the squaring circuit may be replaced by an analog full-wave rectifier (not shown), coupled between the output terminal of the VGA 114 and the input terminal of the ADC 116. Although this circuitry may make the system non-linear, it is contemplated that the circuit may still be operable according to a linear approximation, at least within a proscribed operating range.

The logarithmic power estimate signal from the $\log_2(x)$ circuit 206 is applied to the subtrahend input port of a subtractor 208 of the gain control circuit 250. The minuend input port of the subtractor 208 is coupled to receive a user programmed target level $T_{L,IF}$. The subtractor 208 provides the difference between $T_{L,IF}$ and the logarithmic power estimate. This difference is an error signal, $e_{IF}$, and is provided to a loop filter 210. The filter 210 contains both proportional and integral terms to produce an output signal $e_{IF,FILT}$. The filtering operation performed by the loop filter 210 may be represented by equation (1).

$$e_{IF,FILT}(t) = k_1 e_{IF}(t) + k_2 \int_t e_{IF}(t)dt \tag{1}$$

where $k_1$ is a proportional constant and $k_2$ is an integral constant. Exemplary values of $k_1$ and $k_2$ are 100 and 70.7. The integrator in the loop filter 210 may be reset responsive to a signal applied to its reset input terminal, R. In the exemplary embodiment of the invention, the loop filter may be implemented by two digital multipliers (not shown), an accumulator (not shown) and an adder (not shown). One digital multiplier multiplies the input signal by $k_1$, the accumulator maintains a sum of successive values of the input signal in an accumulator register and the second multiplier multiplies the result by $k_2$. The adder sums the values provided by the first and second digital multipliers. In this exemplary embodiment, the integrator is reset by setting the contents of the accumulator register to zero.

Another error signal is generated based on the signal power level provided by the power monitor 122 (shown in FIG. 1). As described above, the power monitor 122 used in the exemplary embodiment of the invention is a logarithmic power monitor. In the exemplary embodiment, the signal produced by the power monitor 122 is digitized by an ADC 230 and applied to the subtrahend input port of a subtractor 232 of the gain control circuit 250. A user provided constant, $T_{L,RF}$, representing a desired level of the logarithmic power signal is applied to the minuend input port of the subtractor 232. The output signal of the subtractor 232 is a wide-band error signal, $e_{RF}$. This signal is processed by a loop filter 234 which, in the exemplary embodiment, may be identical to the loop filter 210. The output signal of the loop filter 234 is a filtered wide-band error signal, $e_{RF,FILT}$.

The output signal of the loop filter 210 is multiplied by programmable constants $K_{G1}$ and $K_{D1}$ in respective multipliers 212 and 236, the output signals of which are applied to respective combining circuits 216 and 240. The output signal of the loop filter 234 is multiplied by programmable constants $K_{G2}$ and $K_{D2}$ in respective multipliers 214 and 238, the output signals of which are also applied to the combining circuits 216 and 240. In the exemplary embodiment of the invention, the constants $K_{G1}$, $K_{G2}$, $K_{D1}$ and $K_{D2}$ may all have a value of one. As described below, the values of these constants depend on the operational characteristics of the VGA's 108 and 114 (shown in FIG. 1). The combining circuits 216 and 240 of FIG. 2 may or may not be implemented as separate circuits. These circuits implement the functionality described below with reference to FIGS. 4 and 5. In the embodiment shown in FIG. 2, the circuit 216 combines the signals provided by the loop filters 210 and 234 to generate the control signal $V_{IF}$ for the narrow-band VGA 114. Similarly, the circuit 240 combines the output signals of the loop filters 210 and 234 to generate the control signal $V_{RF}$ for the wide-band VGA 108.

Figure 4:
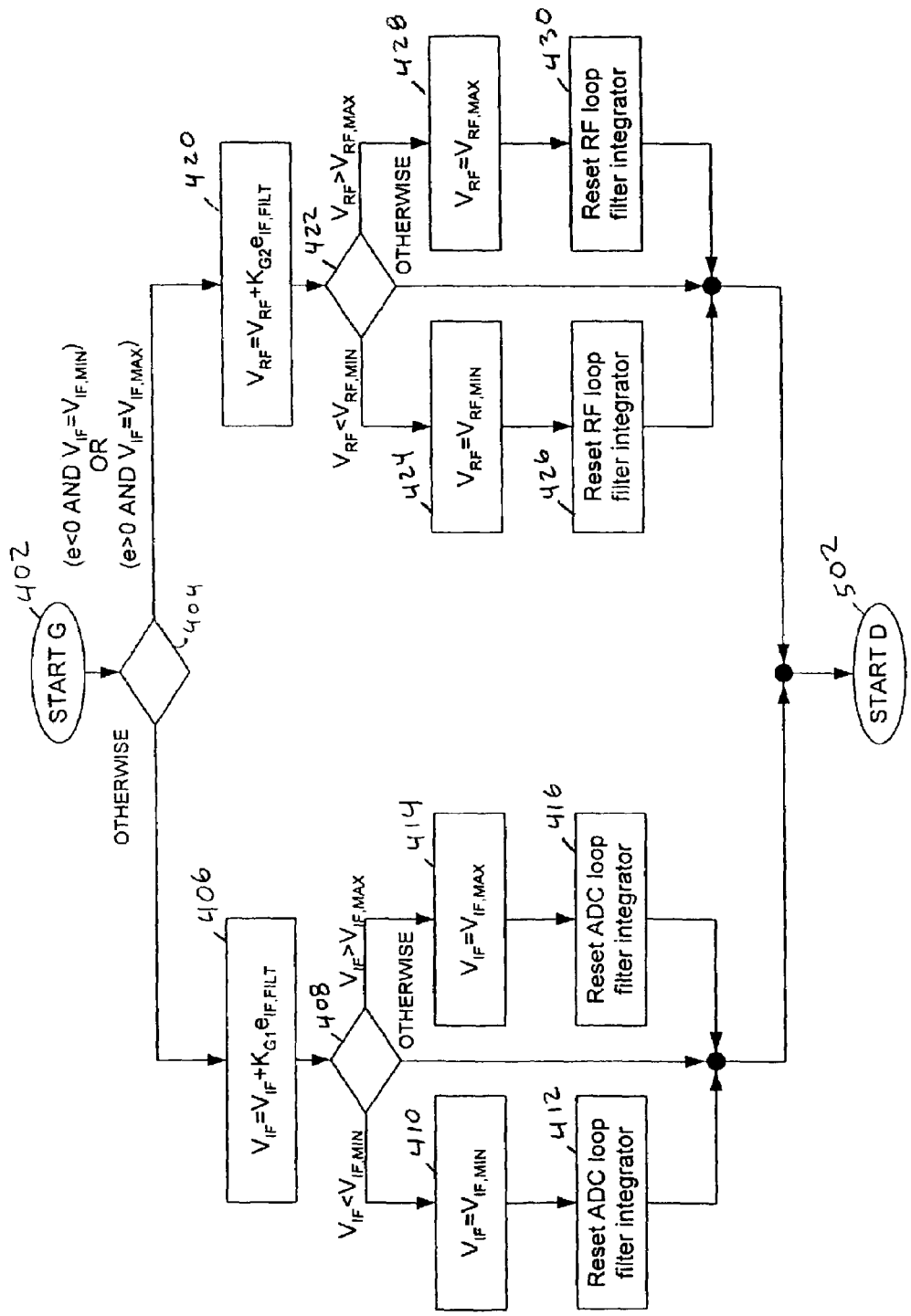
FIGS. 4 and 5 are flow-chart diagrams of exemplary algorithms which may be used to implement the combining circuitry shown in FIG. 2.
Figure 5:
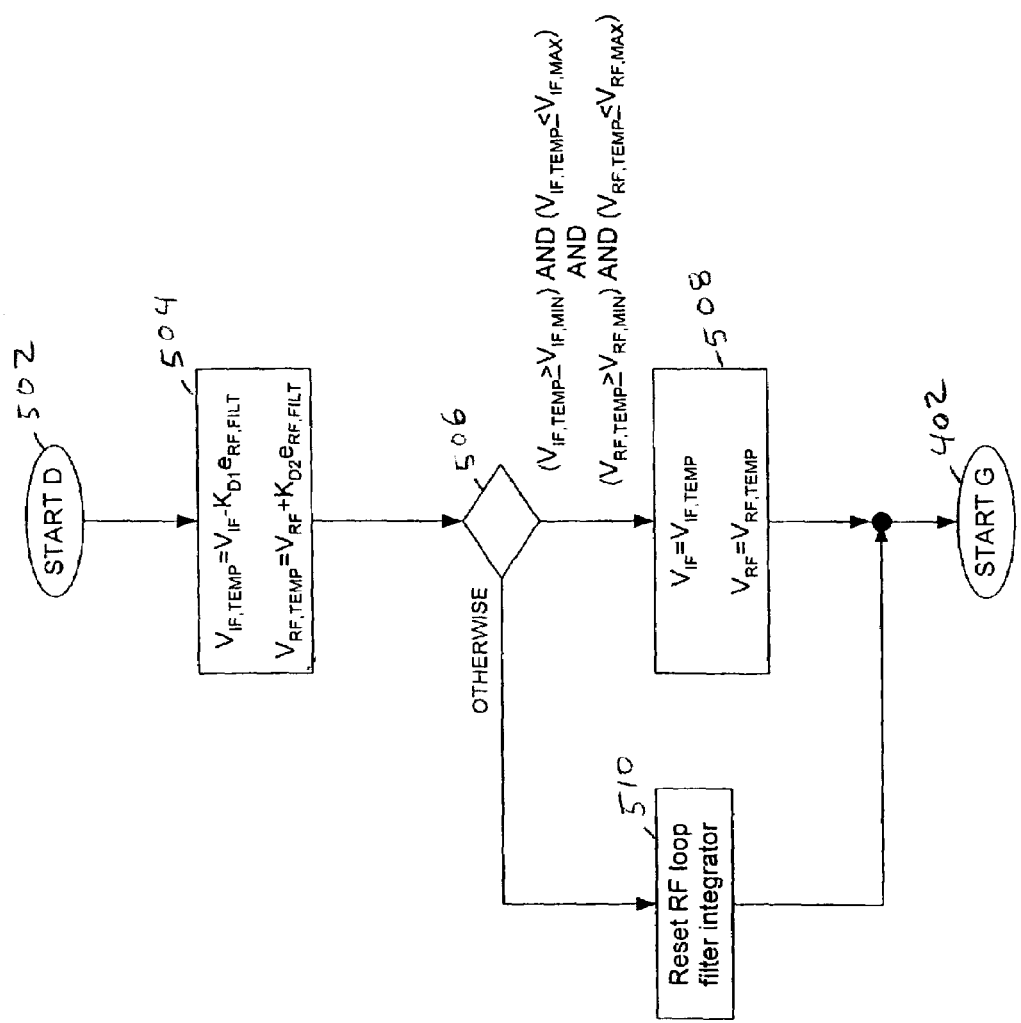

The combining circuits 216 and 240 in the exemplary embodiment of the invention may be implemented as finite-state machines that collectively operate according to the flow-chart diagrams shown in FIGS. 4 and 5. The exemplary circuits 216 and 240 process the error signals to determine adjusted gain values for the VGAs 108 and 114 which tend to minimize the error terms subject to the physical constraints of the system. The two output signals of the combining circuits 216 and 240 are integrated in digital integrators 218 and 242, respectively, and applied to respective digital to analog converters (DAC's) 220 and 244. The output signal of the DAC 220 is the control signal $V_{IF}$ for the narrow-band VGA 114 while the output signal of the DAC 244 is the control signal $V_{RF}$ for the wide-band VGA 108.

If the VGA's 108 and 114 were identical, the four scaling terms $K_{G1}$, $K_{G2}$, $K_{D1}$ and $K_{D2}$, shown in FIG. 2 would not be necessary. The system would operate with only two scaling terms, $K_G$ and $K_D$ (i.e. $K_{G1}=K_{G2}=K_G$ and $K_{D1}=K_{D2}=K_D$). In practice, however, because they have different bandwidths, these amplifiers can be quite different, particularly in terms of their gain as a function of control voltage. As an alternative to having four or two scaling constants, it is contemplated that one of the scaling constants may be defined to be a reference term having unity value and its corresponding multiplier may be eliminated. In this instance, the remaining three or one scaling constant is adjusted relative to the reference term. More generally, the AGC loop includes a normalization constant. The constant can be implemented in the loop filter equations, in the scaling terms or in other parts of the closed loop. When one of the constants is set to unity, and the normalization constant is implemented in the loop filter, the complexity of the loop filter may increase. In the exemplary embodiment, the constant is implemented in the multipliers for the scaling terms to simplify the loop filters.

Figure 3:
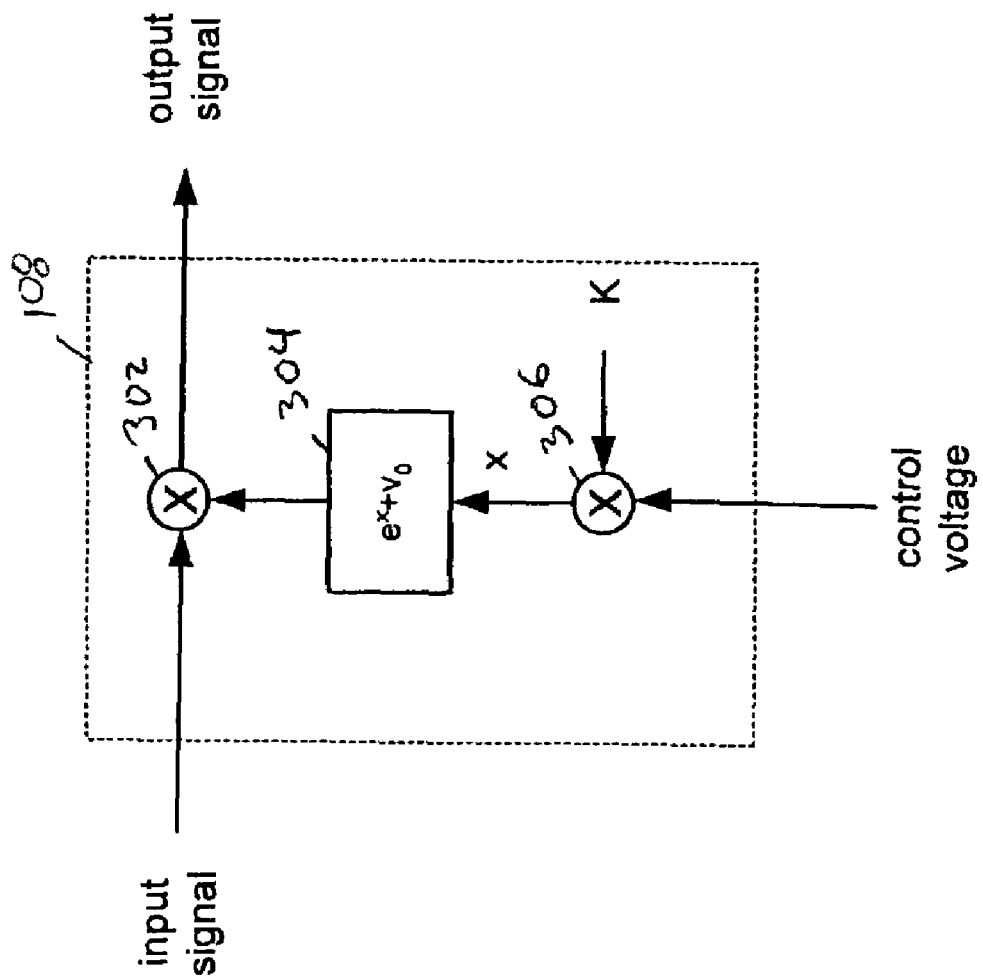
FIG. 3 is a block diagram of a model VGA suitable for use as one of the VGAs shown in FIG. 1.

The amplifiers used in the exemplary embodiment of the invention may be ideally modeled as shown in FIG. 3, each with their own values for K and $V_0$. In the model of VGA 108 shown in FIG. 3, the input signal is multiplied by a gain factor in a multiplier 302. The value of the gain factor is determined by a second multiplier 306 and a function block 304. The multiplier 306 multiplies the input control signal by a constant factor K to obtain an output value x. The function block converts the value x into a value determined by the expression $e^x+V_0$, where e is the natural logarithm base and $V_0$ is an offset voltage for the amplifier 108. It is this value that is applied as the gain factor to the multiplier 302.

Proper selection of the scale factors $K_{G1}$ and $K_{G2}$ ensures that when the $e_{IF,FILT}$ error signal is applied to either VGA 108 or VGA 114, it will result in the same overall gain change (in dB) in the system. Proper selection of the $K_{D1}$ and $K_{D2}$ scale factors ensure that when the $e_{RF,FILT}$ error signal is applied to both of the VGA's, it will result in a net zero gain change in the system. These constant terms de-couple the gain and distribution loops. Proper programming of these constants permits independent operation and analysis of each loop using linear systems theory. If these terms were not included, the cross-coupling between the loops may cause the system to be unstable.

In the case where the VGA gain curves are not well approximated by the diagram of FIG. 3, the programmable constants of $K_{G1}$, $K_{G2}$, $K_{D1}$ and $K_{D2}$ may be replaced by lookup tables or other functional approximations to achieve the same result. Alternatively, look-up tables (not shown) may be placed between the integrators 218 and 242 and their respective DAC's 220 and 244.

The fundamental constraints that exist in the system and influence the design of the combining circuits 216 and 240 are: 1) that the DACs are capable of generating a maximum and minimum output voltage resulting in a corresponding maximum and minimum gain of the associated amplifiers and 2) that the overall system gain is achieved. Therefore, system gain is given priority over gain distribution when required. These constraints are all handled by the combining circuits 216 and 240, described below with reference to FIGS. 4 and 5.

The combining circuit determines values for the signals $V_{IF}$ and $V_{RF}$ using two operations, a gain determination operation and a gain distribution operation. The gain determination operation begins at step 402. At step 404, the operation determines if $e_{IF,FILT}$ is less than zero and $V_{IF}$ equals $V_{IF,\ MIN}$ or if $e_{IF,\ FILT}$ is greater than zero and $V_{IF}$ equals $V_{IF,MAX}$. When either of these conditions occurs, the gain of the narrow-band VGA 114 (shown in FIG. 1) can not be adjusted to compensate for any error in the amplitude of the narrow-band signal. If this condition is met, step 420 is executed which adjusts the value $V_{RF}$ according to equation (2).

$$V_{RF}=V_{RF}+K_{G2}\, e_{IF,FILT} \quad (2)$$

This equation adjusts the gain of the wide-band VGA 108 to obtain the desired signal level at the output terminal of the narrow-band VGA 114. After step 420, the operation performs step 422 which determines if the wide-band control voltage, $V_{RF}$, is less than the minimum wide-band control voltage, $V_{RF,MIN}$, that may be applied to the VGA 108 or greater than the maximum wide-band control voltage, $V_{RF,MAX}$, that may be applied to the VGA 108. If the first condition is met, $V_{RF}$ is set to $V_{RF,MIN}$ at step 424 and, at step 426, the integrator in the loop filter 234 is reset (i.e. the accumulator register is set to zero). If the second condition is met $V_{RF}$ is set to $V_{RF,MAX}$ at step 428 and the integrator in the loop filter 234 is reset at step 430. At step 422, if neither of the conditions is met, $V_{RF}$ is within its operational range (i.e. $V_{RF,MIN} \leq V_{RF} \leq V_{RF,MAX}$) and $V_{RF}$ does is not adjusted. After step 426, 430 or 422, the gain determination operation is complete and the gain distribution operation is performed, beginning at step 502.

At step 404, if condition is not met, then $V_{IF}$ may be adjusted to correct the signal level at the output terminal of the narrow-band VGA 114. Accordingly, the operation performs step 406 which adjusts the control voltage, $V_{IF}$, for the narrow-band VGA 114 according to equation (3).

$$V_{IF} = V_{IF} + K_{G1} \, e_{IF,FILT} \tag{3}$$

Next, at step 408, the operation determines if $V_{IF}$ is less than the minimum narrow-band control voltage, $V_{IF,MIN}$, or greater than the maximum narrow-band control voltage, $V_{IF,MAX}$, that can be applied to the narrow-band VGA 114. If the first condition is met then, at step 410, $V_{IF}$ is set to $V_{IF,MIN}$ and, at step 412, the integrator in the narrow-band loop filter 210 is reset. If the second condition is met, then, at step 414, $V_{IF}$ is set to $V_{IF,MAX}$ and, at step 416, the integrator in the narrow-band loop filter 210 is reset. If, at step 408, neither of the conditions is met, the adjusted value of $V_{IF}$ determined at step 406 is within its operational range (i.e. $V_{IF,MIN} \leq V_{IF} \leq V_{IF,MAX}$) and $V_{IF}$ is not adjusted. After step 412 or 416 or after step 406 if $V_{IF}$ does not need to be adjusted, the gain determination operation is complete and the gain distribution operation is performed, beginning at step 502.

FIG. 5 is a flow-chart diagram that is useful for describing the gain distribution operation performed by the circuits 216 and 240 (shown in FIG. 2). This operation attempts to transfer gain from the narrow-band VGA 114 to the wide-band VGA 108 in order to reduce the noise figure of the circuit while maintaining its overall gain. Alternatively, the operation attempts to transfer gain from the VGA 108 to the VGA 114 to prevent distortion at the ADC 116 (shown in FIG. 1). The operation attempts to transfer gain to the VGA 108 to minimize the error signal $e_{RF}$ subject to the constraint of overall system gain. The operation begins with step 502, shown in FIG. 5. At step 504, the operation determines two trial control voltages, a trial narrow band control voltage, $V_{IF,TEMP}$, and a trial wide-band control voltage, $V_{RF,TEMP}$, according to equations (4) and (5).

$$V_{IF,TEMP} = V_{IF} - K_{D1} \, e_{RF,FILT} \tag{4}$$

$$V_{RF,TEMP} = V_{RF} + K_{D2} \, e_{RF,FILT} \tag{5}$$

Because the narrow-band control voltage is reduced by $K_{D1} \, e_{RF,FILT}$ while the wide-band control voltage is increased by $K_{D2} \, e_{RF,FILT}$ the total gain of the system remains constant.

After step 504, the gain distribution operation determines if the values $V_{RF,TEMP}$ and $V_{IF,TEMP}$ are suitable by determining, at step 506 whether $V_{IF,TEMP}$ is greater than or equal to $V_{IF,MIN}$ and less than or equal to $V_{IF,MAX}$, and, whether $V_{RF,TEMP}$ is greater than or equal to $V_{RF,MIN}$ and less than or equal to $V_{RF,MAX}$. If these conditions are met, then both $V_{IF,TEMP}$ and $V_{RF,TEMP}$ are in their operational range and step 508 assigns $V_{IF,TEMP}$ to $V_{IF}$ and assigns $V_{RF,TEMP}$ to $V_{RF}$. If, at step 506 the condition is not met and either $V_{IF,TEMP}$ or $V_{RF,TEMP}$ is outside of its operational range, neither $V_{IF}$ nor $V_{RF}$ is changed and the integrator of the wide-band loop filter 234 is reset at step 510. After step 508 or step 510, the gain distribution operation is complete and control returns to the gain determination operation at step 402 to process the next error samples, $e_{IF,FILT}$ and $e_{RF,FILT}$.

Figure 6:
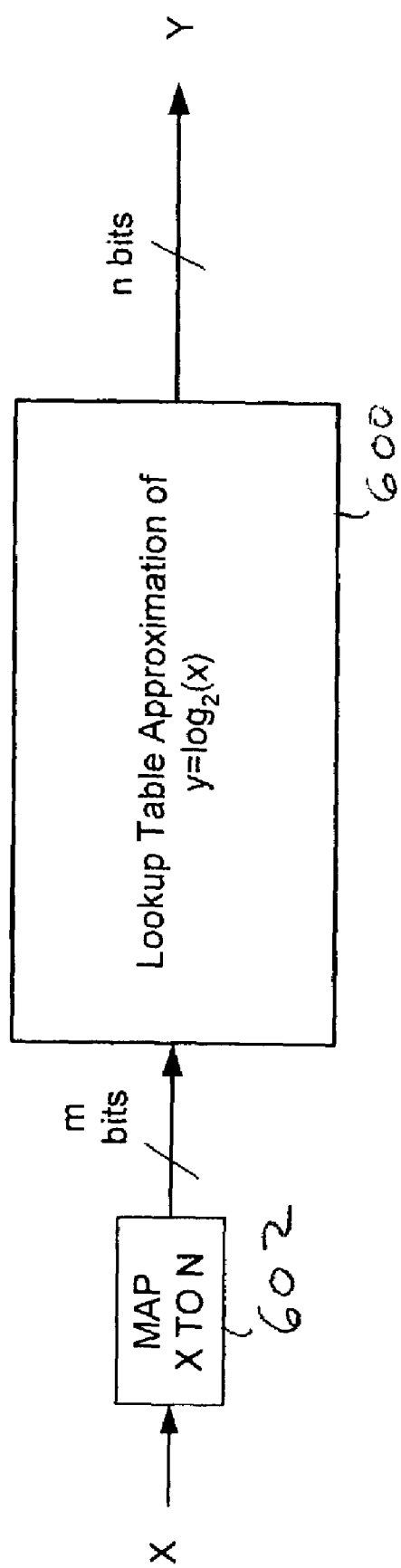
FIGS. 6 and 7B are block diagram of first and second exemplary circuitry suitable for use as the logarithm conversion circuitry shown in FIG. 2.

As shown in FIG. 2, a $\log_2(x)$ circuit 206 is used by the AGC control circuit 120. One method for implementing the circuit 206 is to use a lookup table as shown in FIG. 6. Using this implementation, an m-bit value representing the input value is applied to a look-up table or conversion circuit 602 that maps the input value x into an address value for the look-up table 600 the address input port of the look-up table 600 to provide an n-bit output signal. In this embodiment, each cell in the lookup table 600 is programmed with the value $\log_2(N)$ where N is the address of the cell and may be produced by the circuitry 602 that maps x to N.

Figure 7A:
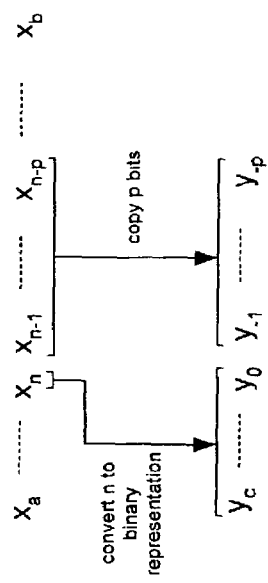
FIG. 7A is a bit transformation chart which is useful for describing the second exemplary circuitry shown in FIG. 7B.
Figure 7B:
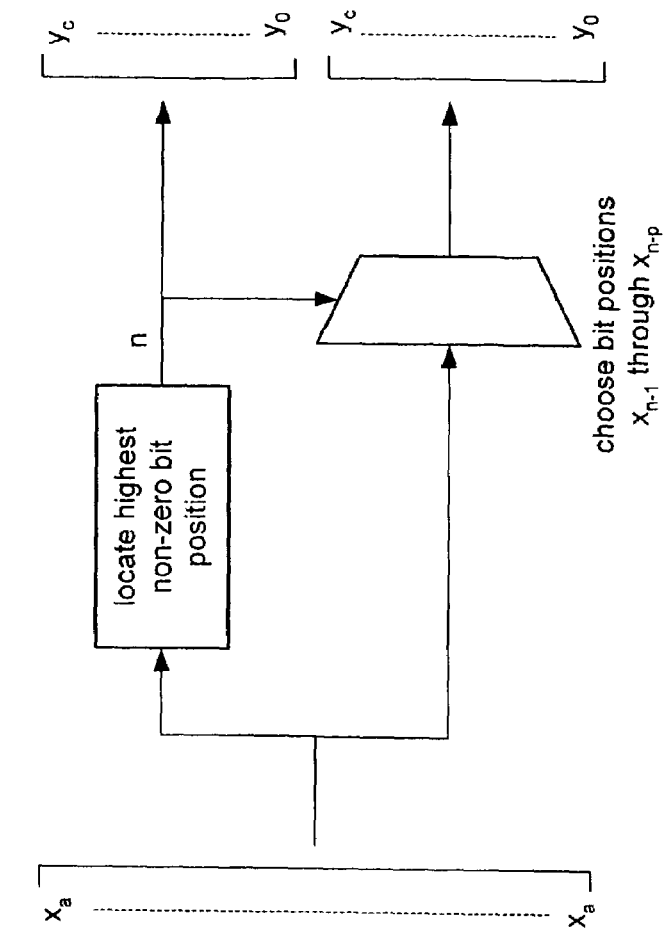

FIGS. 7A and 7B provide an alternative way to realize an approximation to the $\log_2(x)$ function with relatively low complexity that is suitable for VLSI implementation. Note that the function $\log_2(b)$ can be converted to $\log_a(b)$ by application of a scale factor according to equation (6).

$$\log_a(b) = \log_2(b)/\log_2(a) \tag{6}$$

Using standard notation, if $\vec{x}$ is the binary representation of a linear quantity X, where $X_i \in (0,1)$ for $a \geq i \geq b$ and a and b are positive or negative integers defining the range of X. The value of X is given by equation (7).

$$X = \sum_{i=b}^{a} x_i 2^i \tag{7}$$

A similar notation may be used for a value $\vec{y}$ which is the binary representation of a logarithmic quantity Y, where $y_i \in (0,1)$ for $c \geq i \geq -p$, c is a positive integer chosen such that $2^{c+1} - 1 \geq a$, and p is a positive integer chosen based upon the desired precision for Y. The value for Y having c bits to the left of the radix point and p bits to the right of the radix point is given by equation (8).

$$Y = \sum_{i=-p}^{c} y_i 2^i \tag{8}$$

The operation for converting the linear quantity X into its approximate base 2 logarithm representation is shown in FIG. 7A and exemplary circuitry for performing this function is shown in FIG. 7B.

In the method illustrated in FIG. 7A, the most significant one-valued bit in the value $\vec{x}$ is converted to its binary representation. That is to say, it is converted into the binary representation of its bit-position in the value $\vec{x}$. For example, if the most significant 1 is in the tenth bit position of the value $\vec{x}$, the method inserts the binary value "1010" in the most significant bit positions of the logarithmic output value $\vec{y}$. Next, the p bits of the value $\vec{x}$ which are less significant than the most significant 1 are copied into the p less significant bit positions of the logarithmic output value $\vec{y}$. The remaining less significant bits of the value $\vec{x}$ are discarded.

Figure 8:
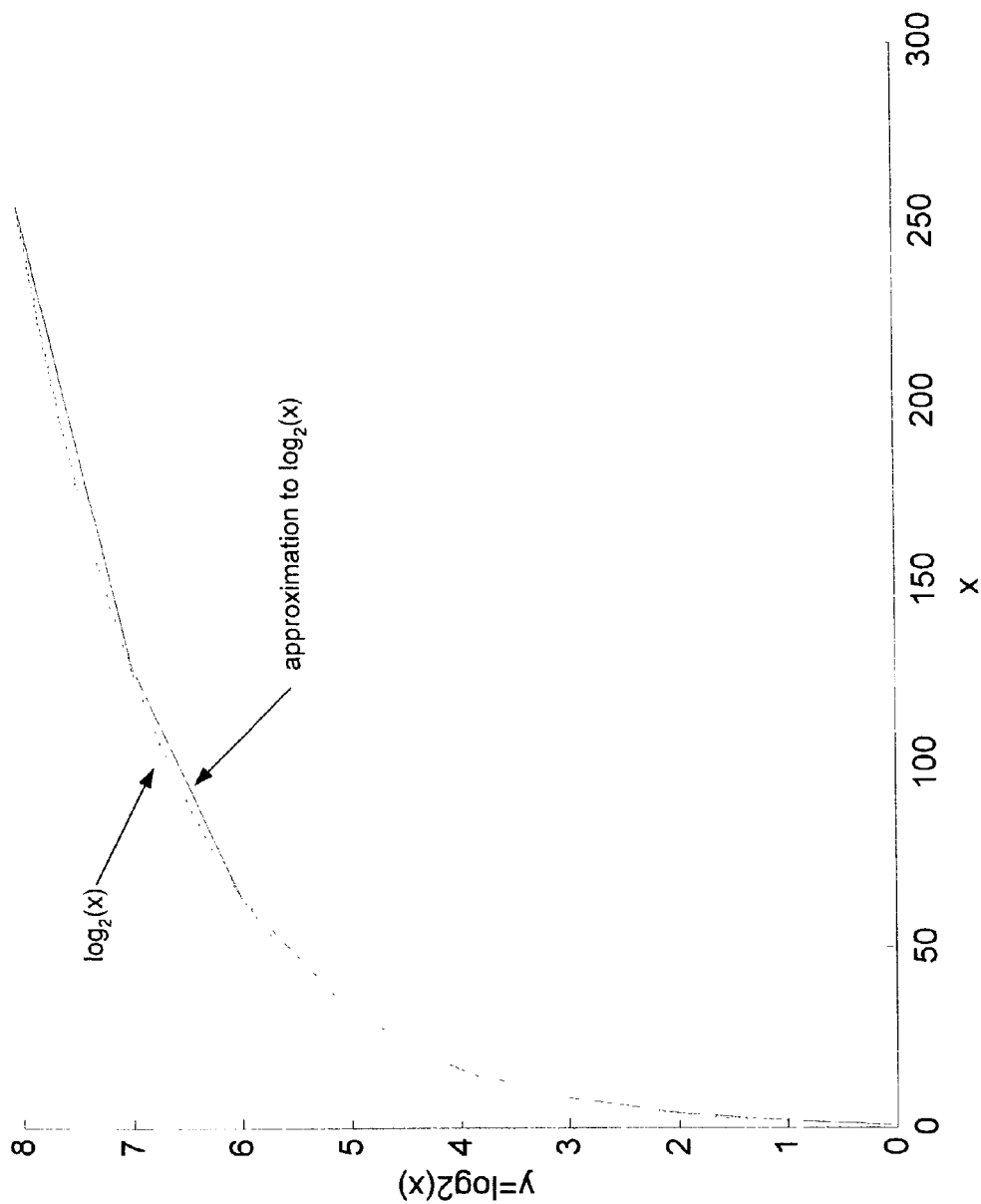
FIG. 8 is a graph of $\log_2(x)$ versus x which is useful for describing the operation of the second exemplary circuitry shown in FIG. 7B.

The exemplary circuitry shown in FIG. 7B that performs the approximate logarithmic conversion includes encoder circuitry 702 that locates the highest non-zero bit position in the input value $\vec{x}$ and encodes that bit-position as a binary value n. This binary value is applied to the bit-positions $y_0$ through $y_c$ of the output value $\vec{y}$ with the least significant bit of the binary value n being at bit position $y_0$. The circuitry shown in FIG. 7B also includes a multiplexer 704, which, responsive to the value n selects bits $X_{n-1}$ to $X_{n-p}$ of the input value $\vec{x}$ and transfers them to bit positions $y_{-1}$ to $y_{-p}$ of the output value $\vec{y}$. The value Y, represented by the curve 802, approximates the logarithm base 2 of X, represented by the curve 804 as shown in the graph of FIG. 8.

The techniques described above for implementing a piece-wise linear approximation to the logarithm function may also be applied to generate a piecewise-linear approximation to an exponential function. It may be desirable to implement such a circuit, for example, in an embodiment of the subject invention in which one or both of the VGA circuits is implemented as a digital amplifier conforming to the block diagram shown in FIG. 3.

Figure 9:
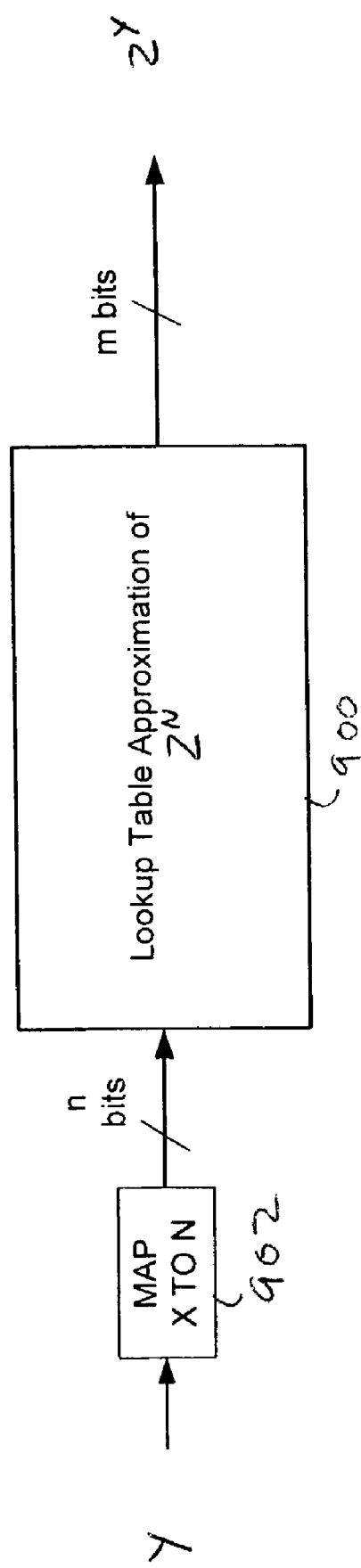

One way in which an exponential function may be implemented is by using a lookup table 900 as shown in FIG. 9. As with the look-up table shown in FIG. 6, the address values applied to a mapping circuit 902 that maps the value y to N. The address values N are applied to the look-up table 900 and the output values provided by the look-up table 900 are approximations of the function $2^N$.

An approximation of $2^y$ may also be generated using an algorithm that is the inverse of the algorithm described above to generate the logarithm value. An example of the exponential algorithm is shown in FIG. 10A and exemplary circuitry for calculating the exponential value $2^y$ is shown in FIG. 10B. As shown in FIG. 10A, the value $\vec{x}$ is divided into four bit ranges, $X_a$ to $X_{n+1}$, $X_n$, $X_{n-1}$ to $X_{n-p}$ and $X_{n-p-1}$ to $X_b$. The value of n, that is to say the bit position of $X_n$ is determined from the bits to the left of the radix point of the value $\vec{y}$ (i.e. bits $y_c$ to $y_0$). The remaining bits in the input value, bits y−1 to y−p are copied into the bit positions that are immediately less significant to the bit position n (i.e. the third bit range $X_{n-1}$ to $X_{n-p}$). The remaining bits in the other two bit-ranges, $X_a$ to $X_{n+1}$ and $X_{n-p-1}$ to $X_b$ are all set to zero.

Figure 11:
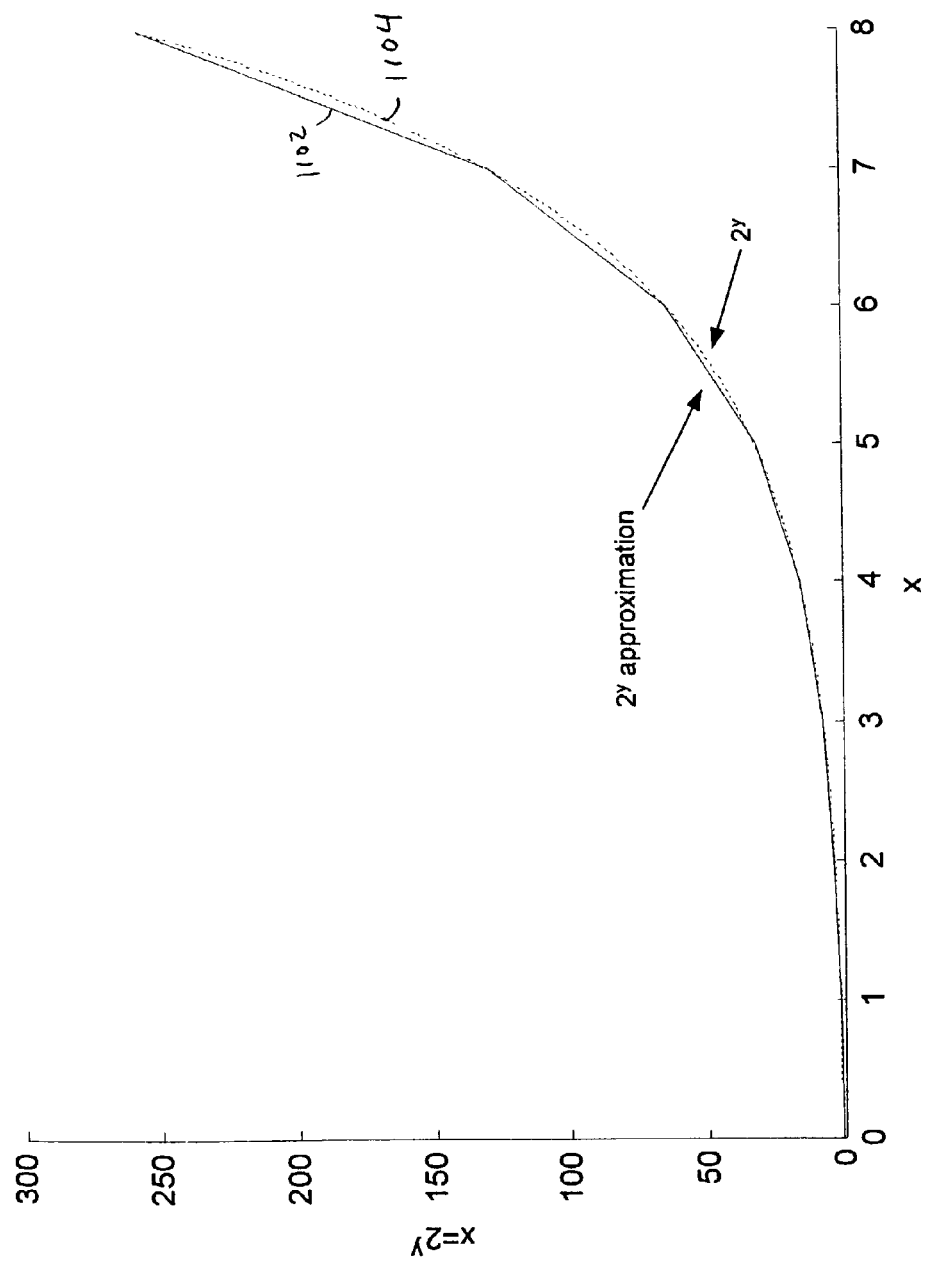
FIG. 11 is a graph of $2^y$ versus y which is useful for describing the operation of the second exemplary circuitry shown in FIG. 10B.

Exemplary circuitry for implementing the exponential function is shown in FIG. 10B. This circuitry includes an input y register 1001, an output x register 1006, a decoder circuit 1002 and a demultiplexer 1004. The circuitry operates as follows. The x register is initialized by having all of its bits reset to zero. Next, the decoder circuit 1002 translates the c+1 most significant bits (i.e. bits $y_0$ to $y_c$) of the value in the input register 1001 into a number n and then sets the bit in the register 1006 at the bit position n (i.e. $X_n$) to unity. The number provided by the decoder circuit 1002 is also applied to the demultiplexer 1004 and causes the demultiplexer to copy the bits in the register 1001 at bit positions $y_{-1}$ to $y_{-p}$ into bit positions $X_{n-1}$ to $X_{n-p}$ of the register 1006. When this operation is complete, the value in register 1006 is an approximation of the value $2^6$, as shown by the graph of FIG. 11. In FIG. 11, curve 1104 represents $2^y$ and curve 1102 represents the approximation of $2^y$ produced by the circuitry shown in FIG. 10. It is noted that the function $2^x$ can be converted to $b^y$ by application of the appropriate scale factor to x (i.e. y=ax).

While the present invention has been described in terms of exemplary embodiments, it is contemplated that it may be practiced as described above with variations within the scope of the following claims. For example, although the invention is described as being implemented by a combination of analog and digital circuitry, it is contemplated that it may be implemented entirely in analog circuitry or entirely in digital circuitry. Digital multipliers that multiply a signal by a constant value may be implemented as analog amplifiers. The squaring circuit 202 of FIG. 2 may be implemented as a two-quadrant multiplier. The subtractors 208 and 232 may be implemented as unity-gain differential amplifiers. The loop filters 210 and 234 may be implemented as amplifiers coupled to analog integrators. The operations performed by the combining circuitry 216 and 240 may be implemented using discrete tine analog circuitry, employing sample and hold circuits, comparators, differential amplifiers and summing amplifiers. Alternatively, it is contemplated that the entire system or any part of it may be implemented in digital circuitry or as computer program instructions controlling a general purpose computer. The computer program instructions may reside on a computer readable carrier such as a memory card, magnetic or optical disc, or on a radio frequency (RF) or audio frequency (AF) carrier wave.

The invention claimed is:

1. An automatic gain control (AGC) circuit comprising:
   an AGC loop including a first variable gain amplifier (VGA) and a second VGA; and
   control circuitry for controlling respective amounts of gain applied by the first and second VGAs, the control circuitry comprising:
      a first power monitor circuit, coupled to the first VGA for providing a first power level signal representing an average power level of an output signal of the first VGA;
      a second power monitor circuit, coupled to the second VGA for providing a second power level signal representing an average power level of an output signal of the second VGA;
      difference circuitry which generates first and second error signals representing respective differences between the first and second power level signals and first and second target signals, representing desired power levels for the output signals of the first and second VGAs respectively, and
      a combining circuit, responsive to the first and second error signals, which adjusts a total gain to be applied by the first and second VGAs and which determines a portion of the total gain to be applied by the first VGA and a portion of the total gain to be applied by the second VGA and distributes the total gain between the first and second VGAs in accordance with the determination;
      wherein the control circuitry is responsive to an output signal of the AGC circuit to transfer gain from the second VGA to the first VGA to reduce a noise figure of the AGC circuit while maintaining the total gain.

2. An AGC circuit according to claim 1, wherein the control circuitry further includes:
   filtering circuitry, coupled to receive the first and second error signals for generating first and second gain control signals;
   at least one scaling circuit, coupled to receive at least one of the first and second gain control signals for adjusting the at least one of the first and second gain control signals to produce first and second scaled gain control signals;
   wherein the first and second scaled gain control signals are used to control the gains of the respective first and second VGAs and, for substantially equal changes in the first and second gain control signals, the first and second scaled gain control signals produce substantially equal changes in gain in the respective first and second VGAs.

3. An AGC circuit according ta claim 1, wherein the combining circuit determines if the gain of the second VGA can be adjusted and adjusts the gain of the second VGA to adjust the total gain if the gain of the second VGA can be adjusted and, wherein the first combining circuit adjusts the gain of the first VGA to adjust the total gain if the gain of the second VGA can not be adjusted.

4. An AGC circuit according to claim 3, wherein the combining circuit changes the gain of the second VGA by a predetermined amount in a first sense and changes the gain of the first VGA by an amount substantially equal to the predetermined amount in a sense opposite to the first sense.

5. An AGC circuit according to claim 1, wherein the first and second VGAs are analog amplifiers and the control circuitry further comprises:
   an analog-to-digital converter (ADC) coupled to receive output signals provided by the second VGA for providing digital amplitude values;
   digital conversion circuitry, coupled to the ADC for receiving the digital amplitude values, which converts the digital amplitude signals into digital logarithmic amplitude values; and
   wherein the difference circuitry compares the digital logarithmic amplitude values to a target logarithmic amplitude value to calculate the second error signal; and
   a loop filter which processes the respective difference values to provide input signals to the first and second combining circuits.

6. An AGC circuit according to claim 5, wherein the digital conversion circuitry includes:
   en encoder circuit, responsive to a bit-position of a most significant non-zero bit of a digital amplitude value for translating the bit position into an integer part of a respective one of the digital logarithmic amplitude values; and
   a multiplexer circuit, responsive to the bit position of the most significant non-zero bit of the digital amplitude value for copying bits in the digital amplitude value occupying less significant bit positions than the most significant bit position to form a fractional part of the respective one of the digital logarithmic amplitude values.

7. An automatic gain control (AGC) circuit according to claim 1, wherein:
   at least one of the first VGA and the second VGA is a digital VGA, which operates according to the equation:

$$OUT = e^{KIN} + V_0$$

where "KIN" is the input signal to the digital VGA, IN, multiplied by a constant, "k", "$V_0$" is an amplifier offset voltage, "e" is the natural logarithm base and "OUT" is the output signal of the digital VGA;
   wherein the digital VGA includes a decoder that translates an integer part of the signal KIN into a most-significant non-zero bit position in the signal OUT, and a demultiplexer that copies p bits of a fractional part of the signal KIN as p bits in the signal OUT that are less significant than the most-significant non-zero bit position.

8. An automatic gain control (AGC) circuit comprising:
   a first variable gain amplifier (VGA), which amplifies a first signal occurring at a first point in the AGC circuit by an amount determined by a first gain control signal to produce a first amplified signal;
   a first power monitor, coupled to receive the first amplified signals for providing a first power signal, representing a measure of signal power for the first amplified signal;
   a second VGA, which amplifies a second signal occurring at a second point in the AGC circuit by an amount determined by a second gain control signal to provide a second amplified signal, wherein the second point in the circuit is distinct from the first point in the circuit and second signal has been amplified by the first VGA;
   a second power monitor, coupled to receive the second amplified signals for providing a second power signal, representing a measure of signal power for the second amplified signal;
   difference circuitry coupled to receive the first and second power signals and respective first and second target signals and which generates first and second error signals representing respective differences between the first and second power signals and the first and second target signals; and
   control circuitry, coupled to the first and second power monitors for receiving the first and second error signals and coupled to the first and second VGAs for providing the first and second gain control signals, the control circuitry including:
   combining circuitry, responsive to the first and second error signals for determining a total gain to be applied by the first and second VGAs, for determining a portion of the total gain to be applied by the first VGA and a portion of the total gain to be applied by the second VGA and for generating the first and second gain control signals.

9. An automatic gain control (AGC) method for use in a AGC circuit that includes an AGC loop including a first variable gain amplifier (VGA) having an input signal and an output signal which is a function of the input signal and a first adjustable gain and a second VGA having an input signal and an output signal which is a function of the input signal of the second VGA and a second adjustable gain, the method comprising the steps of:
   monitoring the output signal of the first VGA to provide a first power level signal:
   monitoring the output signal of the second VGA to provide a second power level signal;
   generating first and second error sianals, representing respective differences between the first and second power level signals and first and second target signals;
   responsive to the first and second error sianals, determining an amount by which a sum of the first adjustable gain and the second adjustable gain are to be adjusted as a total gain adjustment; and
   responsive to the output signal of the second VGA, dividing the determined total gain adjustment between the first VGA and the second VGA to minimize the gain of the second VGA while maintaining the determined total gain adjustment, to reduce a noise figure of the output signal of the second VGA.

10. An AGC method according to claim 9 further including the steps of:
    filtering the first and second error signals to generate first and second gain control signals;
    scaling at least one of the first and second gain control signals to adjust the at least one of the first and second gain control signals to produce first and second scaled gain control signals; and
    controlling the gains of the first and second VGAs using the first and second scaled gain control signals, wherein, for substantially equal changes in the first and second gain control signals, the first and second scaled gain control signals produce substantially equal changes in gain in the respective first and second VGAs.

11. An AGC method according to claim 9, wherein the step of dividing the determined gain adjustment between first VGA and the second VGA includes the steps of:

determining if the gain of the second VGA can be adjusted and adjusting the gain of the second VGA to the total gain adjustment if the gain of the second VGA can be adjusted; and adjusting the gain of the first VGA to the total gain adjustment if the gain of the second VGA can not be adjusted.

12. An AGC method according to claim 11, wherein the step of dividing the total gain adjustment between the first and second VGAs includes the step of changing the gain of the second VGA by a predetermined amount in a first sense and changing the gain of the first VGA by an amount substantially equal to the predetermined amount in a second sense, opposite to the first sense.

13. An AGC method according to claim 9, wherein the first and second VGAs are analog amplifiers and the method further comprises the steps of:

digitizing output signals provided by the second VGA to provide digital amplitude values;

converting the digital amplitude values into digital logarithmic amplitude values;

comparing the digital logarithmic amplitude values to a target logarithmic amplitude value to calculate respective difference values between the target value and the respective digital logarithmic amplitude values to generate the second error signal; and filtering the second error signal to determine the total gain adjustment.

14. An AGC method according to claim 13, wherein the step of converting the digital amplitude values into digital logarithmic amplitude values includes the steps of;

determining a bit-position of a most significant non-zero bit of a digital amplitude value;

translating the determined bit position into an integer part of a respective one of the digital logarithmic amplitude values; and copying bits in the digital amplitude value occupying less significant bit positions than the most significant bit position to form a fractional part of the respective one of the digital logarithmic amplitude values.

15. A computer readable carrier including computer program instructions that cause a computer to implement an automatic gain control (AGC) method for use in a AGC circuit that includes an AGC loop including a first variable gain amplifier (VGA) having an input signal and an output signal which is a function of the input signal and a first adjustable gain and a second VGA having an input signal and an output signal which is a function of the input signal of the second VGA and a second adjustable gain, the method comprising the steps of:

monitoring the output signal of the first VGA to provide a first power level signal:

monitoring the output signal of the second VGA to provide a second power level signal;

generating first and second error signals, representing respective differences between the first and second power level signals and first and second target signals;

responsive to the first and second error sianals, determining an amount by which a sum of the first adjustable gain and the second adjustable gain are to be adjusted as a total gain adjustment; and dividing the determined total gain adjustment between the first VGA and the second VGA to minimize the gain of the second VGA.

16. A computer readable carrier according to claim 15, wherein the computer program instructions further cause the computer to implement the steps of:

filtering the first and second error signals to generate first and second gain control signals;

scaling at least one of the first and second gain control signals to adjust the at least one of the first and second gain control signals to produce first and second scaled gain control signals; and controlling the gains at the first and second VGAs using the first and second scaled gain control signals, wherein, for substantially equal changes in the first and second gain control signals, the first and second scaled gain control signals produce substantially equal changes in gain in the respective first and second VGAs.

* * * * *